(12) United States Patent
Lee et al.

(10) Patent No.: US 10,961,118 B2
(45) Date of Patent: *Mar. 30, 2021

(54) WAFER LEVEL INTEGRATED MEMS DEVICE ENABLED BY SILICON PILLAR AND SMART CAP

(71) Applicant: Taiwan Semiconductor Manufacturing Co., Ltd., Hsin-Chu (TW)

(72) Inventors: Yi-Chia Lee, Yilan County (TW); Chin-Min Lin, Hsinchu (TW); Cheng San Chou, Hsin Chu (TW); Hsiang-Fu Chen, Zhubei (TW); Wen-Chuan Tai, Hsinchu (TW); Ching-Kai Shen, Zhubei (TW); Hua-Shu Ivan Wu, Hsinchu County (TW); Fan Hu, Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/584,752

(22) Filed: Sep. 26, 2019

(65) Prior Publication Data

US 2020/0024137 A1 Jan. 23, 2020

Related U.S. Application Data

(63) Continuation of application No. 15/823,969, filed on Nov. 28, 2017, now Pat. No. 10,556,792.

(51) Int. Cl.
*B81C 1/00* (2006.01)
*B81B 7/02* (2006.01)

(52) U.S. Cl.
CPC ............ *B81C 1/00293* (2013.01); *B81B 7/02* (2013.01); *B81B 2201/0235* (2013.01);
(Continued)

(58) Field of Classification Search
CPC .......................... B81C 1/00055–00103; B81C 1/00277–00293; B81B 7/006;
(Continued)

(56) References Cited

U.S. PATENT DOCUMENTS 9,567,208 B1  2/2017 Cheng et al.
9,567,210 B2  2/2017 Cheng et al.
(Continued)

FOREIGN PATENT DOCUMENTS

WO 2013003789 A1 1/2013

OTHER PUBLICATIONS

Non-Final Office Action dated Aug. 31, 2018 for U.S. Appl. No. 15/823,969.
(Continued)

*Primary Examiner* — Vincent Wall
(74) *Attorney, Agent, or Firm* — Eschweiler & Potashnik, LLC

(57) ABSTRACT

The present disclosure relates to a micro-electro mechanical system (MEMS) package and a method of achieving differential pressure adjustment in multiple MEMS cavities at a wafer-to-wafer bonding level. In some embodiments, a ventilation trench and an isolation trench are concurrently within a capping substrate. The isolation trench isolates a silicon region and has a height substantially equal to a height of the ventilation trench. A sealing structure is formed within the ventilation trench and the isolation trench, the sealing structure filing the isolation trench and defining a vent within the ventilation trench. A device substrate is provided and bonded to the capping substrate at a first gas pressure
(Continued)

and hermetically sealing a first cavity associated with a first MEMS device and a second cavity associated with a second MEMS device. The capping substrate is thinned to open the vent to adjust a gas pressure of the second cavity.

20 Claims, 13 Drawing Sheets

(52) U.S. Cl.
CPC ............... *B81B 2201/0242* (2013.01); *B81B 2203/0315* (2013.01); *B81B 2207/095* (2013.01); *B81C 2201/0125* (2013.01); *B81C 2203/0118* (2013.01); *B81C 2203/0145* (2013.01); *B81C 2203/036* (2013.01); *B81C 2203/037* (2013.01)

(58) Field of Classification Search
CPC ..... B81B 7/0035–0041; B81B 2207/095–096; H01L 23/481; H01L 21/76898
See application file for complete search history.

(56) References Cited

U.S. PATENT DOCUMENTS

| | | | |
|---|---|---|---|
| 9,656,857 | B2 | 5/2017 | Huang et al. |
| 9,890,035 | B2 | 2/2018 | Breitling et al. |
| 2005/0095833 | A1 | 5/2005 | Lutz et al. |
| 2011/0156242 | A1 | 6/2011 | Sakaguchi et al. |
| 2014/0227816 | A1 | 8/2014 | Zhang et al. |
| 2015/0102437 | A1 | 4/2015 | Liu et al. |
| 2015/0123217 | A1 | 5/2015 | Reinmuth et al. |
| 2016/0130137 | A1* | 5/2016 | Huang ................ B81C 1/00285 257/415 |
| 2016/0167954 | A1 | 6/2016 | Gogoi |
| 2016/0244325 | A1* | 8/2016 | Cheng ....................... B81B 7/02 |
| 2017/0233249 | A1 | 8/2017 | Huang et al. |

OTHER PUBLICATIONS

Final Office Action dated Apr. 5, 2019 for U.S. Appl. No. 15/823,969.
Notice of Allowance dated Jul. 3, 2019 for U.S. Appl. No. 15/823,969.

\* cited by examiner

WAFER LEVEL INTEGRATED MEMS DEVICE ENABLED BY SILICON PILLAR AND SMART CAP

REFERENCE TO RELATED APPLICATION

This application is a Continuation of U.S. application Ser. No. 15/823,969, filed on Nov. 28, 2017, the contents of which are hereby incorporated by reference in their entirety.

BACKGROUND

Micro-electromechanical systems (MEMS) devices, such as accelerometers, gyroscopes, pressure sensors, and microphones, have found widespread use in many modern day electronic devices. For example, MEMS accelerometers are commonly found in automobiles (e.g., in airbag deployment systems), tablet computers, or in smart phones. MEMS devices may be advantageously bonded in a wafer to wafer bonding process, and for some applications, various MEMS devices need to be integrated into one MEMS package. These may include some MEMS sensors requiring different ambient pressure conditions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
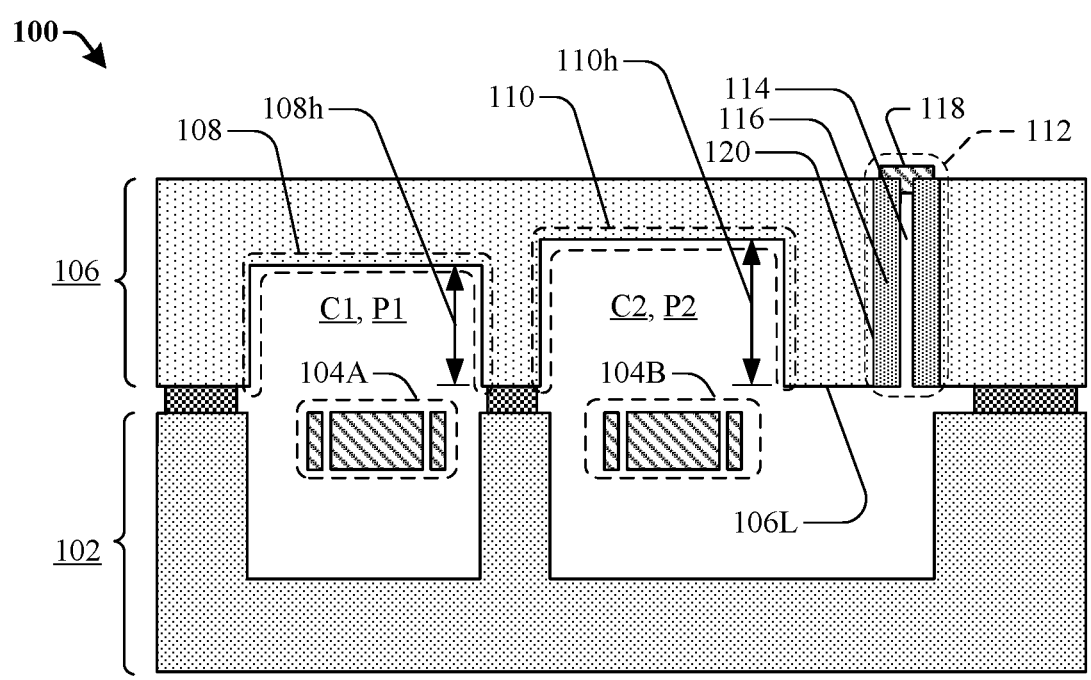
FIG. 1 illustrates a cross-sectional view of some embodiments of a multi-cavity, multi-pressure MEMS package.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

Multiple MEMs device may be integrated onto a same integrated chip in recent generations of MEMs ICs. For example, motion sensors are used for motion-activated user interfaces in consumer electronics such as smartphones, tablets, gaming consoles, smart-TVs, and in automotive crash detection systems. To capture a complete range of movements within a three-dimensional space, motion sensors often utilize an accelerometer and a gyroscope in combination. The accelerometer detects linear movement. The gyroscope detects angular movement. To meet consumer demand for low cost, high quality, and small device footprint, the accelerometer and the gyroscope can be formed from micro-electromechanical system (MEMS) devices, which are integrated together on a same substrate. Although they share the same substrate, and hence a same manufacturing process, the accelerometer and the gyroscope utilize different operating conditions. For example, the gyroscope is often packaged in a low pressure environment or vacuum for optimal performance. In contrast, the accelerometer is often packaged at a predetermined pressure (e.g., 1 atmosphere) to produce a smooth frequency response.

Conventional fabrication techniques for multi-cavity multi-pressure MEMS device chips often rely on chip to chip bonding of the capping substrate to the device substrate in order to achieve accurate and differential pressure control between multiple cavities. Such processes are inefficient compared to wafer to wafer bonding using the methods described herein. When wafer to wafer bonding is attempted, however, without the aid of a gas pressure adjustment vent and sealing system as disclosed herein, setting cavity pressures accurately becomes complicated and may be further impacted by post-bonding outgassing of the adhesive or other materials. The solution disclosed herein preserves wafer-to-wafer bonding between MEMS device substrates and capping substrates, and provides for a vent to independently adjust the cavity pressure of individual MEMS devices at the bonded wafer level.

Additionally, there is generally a need to construct a conductive path through the hermetic seal of a MEMS cavity in order to electrically connect the MEMS devices to external circuitry outside of the contained MEMS package. The solution disclosed herein further provides for a conductive silicon pillar, laterally offset from the vent and within a MEMS cavity, to provide an electrical path through the capping substrate. Additionally, the wafer-to-wafer bonding solution disclosed herein serves both to hermetically seal the vented MEMS cavity and to electrically connect the MEMS devices to the conductive silicon pillar.

The present disclosure is directed to a MEMS package comprising multiple MEMS devices that are integrated together on one substrate. The MEMS package comprises a device substrate comprising a first MEMS device and a second MEMS device, and a capping substrate bonded to the device substrate. The capping substrate comprises a first recessed region enclosing a first cavity associated with the first MEMS device, and a second recessed region enclosing a second cavity associated with the second MEMS device. The capping substrate further comprises a ventilation trench laterally spaced apart from the second recessed region and within the second cavity, and a sealing structure arranged within the ventilation trench. The sealing structure comprises a lining structure defining a vent in fluid communication with the second cavity, and a cap arranged within the vent and configured to seal the second cavity at a second gas pressure that is different than a first gas pressure of the first cavity. Other embodiments are also disclosed. In some embodiments, the lining structure comprises multiple layers comprising metal, conductive and dielectric layers.

FIG. 1 shows a cross-sectional view of a MEMS package 100 according to some embodiments. The MEMS package 100 comprises a device substrate 102 and a capping substrate 106 bonded together. The device substrate comprises a first MEMS device 104A and a second MEMS device 104B. The capping substrate 106 comprises first and second recessed regions 108 and 110. The first and second recessed regions, 108 and 110, may have heights 108$h$ and 110$h$, respectively, defined as the distance from a lower surface of the capping substrate to an upper surface of the respective recessed region. A first sealed cavity C1 is defined by (or at least partially defined by) the first recessed region 108 to receive the first MEMS device 104A and, and a second cavity C2 is defined by (or at least partially defined by) the second recessed region 110 to receive the second MEMS device 104B. The capping substrate 106 further comprises a ventilation trench 120 laterally spaced apart from the first recessed region 108 and the second recessed region 110, and arranged within a lower surface 106L of the capping substrate and within the second cavity C2. A sealing structure 112 is arranged within the ventilation trench 120. The sealing structure 112 includes a lining structure 116 that defines a vent 114 in fluid communication with the second cavity C2.

The vent extends from a height above an uppermost surface of the recessed regions to a lower surface 106L of the capping substrate, and is in fluid communication with the second cavity C2. The cap 118 is arranged within the vent 114 and configured to seal the second cavity C2 at a second gas pressure P2 that is different than the first cavity C1 at a first gas pressure P1.

Figure 2:
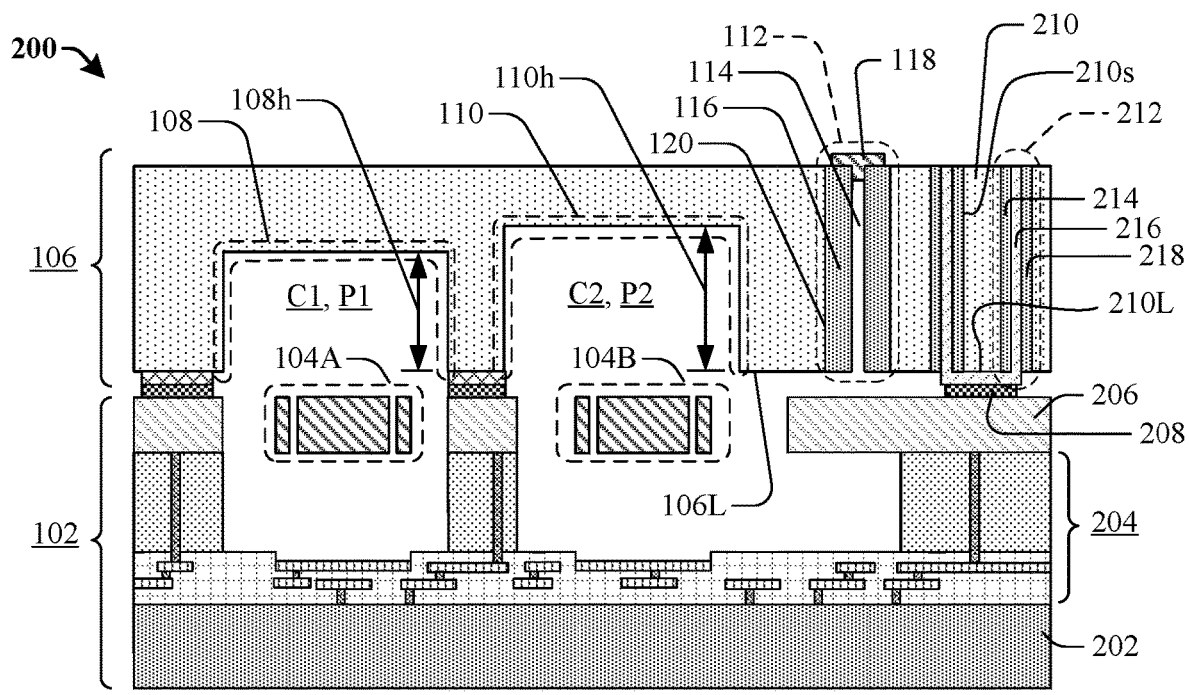
FIG. 2 illustrates a cross-sectional view of a MEMS package according to some other embodiments.

FIG. 2 illustrates a cross-sectional view of a MEMS package 200 according to some other embodiments. In some embodiments, the device substrate 102 may comprise a semiconductor substrate 202 having active elements (e.g., a transistor), a interconnect layer 204 having metallization planes and vias disposed within an inter-metal dielectric (IMD) material, and electrically coupled to the semiconductor devices, and a MEMS substrate 206 that is also electrically coupled to the interconnect layer 204. In some embodiments, MEMS substrate 206 comprises a first MEMS device 104A and a second MEMS device 104B disposed in a horizontal plane. The first MEMS device 104A and second MEMS device 104B may include, for example, a microphone, a gas pressure sensor, an accelerometer, a gyroscope, or any other device that interfaces with the external environment. In one embodiment, the first MEMS device 104A includes an accelerometer and the second MEMS device 104B includes a gyroscope, which together form a motion sensor for a motion-activated user interface or for an automotive crash detection system.

In some embodiments, the capping substrate 106 and the device substrate 102 are bonded together by bonding pads 208. In some embodiments, the bonding pads 208 comprise a metal or metal alloy (hereafter "a metal") and the bond is a eutectic type bond.

In some embodiments, the eutectic bond comprises semiconductor-to-metal bonding between a semiconductor material and a metal material. In some embodiments, the semiconductor material includes at least one of Ge, Si, SiGe or another semiconductor material. In some embodiments, the metal material includes at least one of Al, Cu, Ti, Ta, Au, Ni, Sn, or another metal. In some embodiments, the eutectic bond comprises metal-to-metal bonding between two metal materials each including at least one of Al, Cu, Ti, Ta, Au, Ni, Sn, or another metal. The materials to be bonded are pressed against each other in an annealing process to form a eutectic phase of the materials. For example, a eutectic bonding between Ge and Al is formed at an annealing temperature in a range from 400° C. to 450° C.

In some embodiments, the capping substrate 106 additionally comprises a silicon pillar 210 having sidewalls 210$s$ and a lower surface 210L. The silicon pillar 210 is laterally spaced apart from the sealing structure 112 and from the first recessed region 108 and the second recessed region 110. The silicon pillar 210 may be heavily doped silicon that causes the silicon pillar 210 to be electrically conductive relative to pure silicon.

In some embodiments, the silicon pillar 210 is electrically isolated from the capping substrate 106 by an insulating structure 212. In some embodiments, the insulating structure 212 comprises a first dielectric layer 214 in direct contact with sidewalls 210$s$ of the silicon pillar 210, a polysilicon liner 216 disposed over the first dielectric layer 214 and in direct contact with the lower surface 210L of the silicon pillar 210, and a second dielectric layer 218 disposed over the polysilicon liner 216 and in direct contact with the capping substrate 106. The polysilicon liner 216 provides a conductive path coupled in parallel with the conductive path provided by the silicon pillar 210. In some embodiments, the dielectric layers comprise, for example, silicon oxide, silicon carbide, silicon nitride, SRO, some other dielectric, or any combination of the foregoing. In some embodiments, the dielectric layers are formed concurrently by growing an oxidation layer on facing surfaces of an isolation trench, leaving the center of the trench open for deposition of the polysilicon liner 216.

In some embodiments, a bonding pad 208 is disposed on a lower surface of the polysilicon liner 216 and directly under the lower surface 210L of the silicon pillar 210. In some embodiments, the bonding pad 208 is configured to electrically couple the silicon pillar 210 to the MEMS substrate 206 in conjunction with effecting a bond to the MEMS substrate 206 and defining a seal boundary of the second cavity C2. Thus, the bonding of the capping substrate 106 to the device substrate 102 establishes both electrical coupling from the device substrate 102 through the silicon pillar 210 to the upper surface 106$s$ of the capping substrate 106, and physical definition of a seal boundary of the second cavity C2.

Figure 3A:
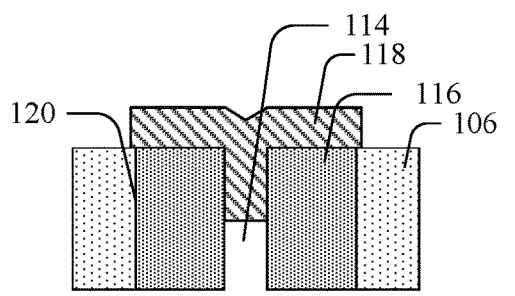
FIGS. 3A-3D illustrate a series of cross-sectional views of some more detailed embodiments of the sealing structure of FIG. 1.

FIGS. 3A-3D illustrate cross-sectional views of part of the sealing structure 112 of the MEMS package according to some embodiments. The sealing structure 112 comprises a lining structure 116 that has the effect of creating a fluid diffusion barrier between the vent 114 and the capping substrate 106. The lining structure 116 may comprise one or a plurality of layers, with at least one layer disposed directly on the sidewalls of the ventilation trench 120 formed within the capping substrate 106, and an opening at an inner surface of the lining structure 116 that defines the vent 114. As shown in FIG. 3A, the lining structure 116 may comprise a single layer of material disposed on the sidewalls of the ventilation trench 120 to provide a gas diffusion barrier between the vent and the capping substrate. In some embodiments, the single layer may be or otherwise comprise, for example, silicon nitride, silicon oxide, silicon oxynitride, or some other dielectric. Further, the single layer may, for example, be formed by a conformal deposition process, and/or may, for example, be formed by CVD, PVD, or some other deposition process.

Figure 3B:
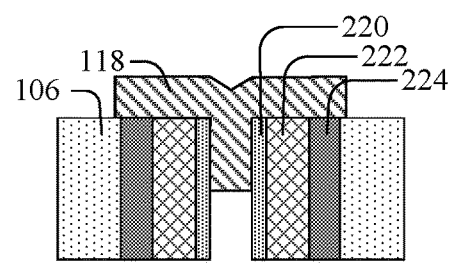

As shown in FIG. 3B, in some embodiments the lining structure 116 may comprise a plurality of layers comprising metal, conductive and dielectric layers. In some embodiments, the dielectric layer 224 is disposed directly on the sidewalls of the ventilation trench 120. In some embodiments, the conductive layer 222 is disposed over the dielectric layer 224. In some embodiments, the metal layer 220 is disposed over the conductive layer 222 and enhances the sealing performance of the lining structure 116. In some embodiments, the metal layer 220 is a bonding layer and is additionally disposed on selected bonding surfaces between the capping substrate 106 and the device substrate 102. In some embodiments, the metal layer 220 effects a eutectic bond between the capping substrate 106 and the device substrate 102. In some embodiments, the metal layer 220 includes at least one of Al, Cu, Ti, Ta, Au, Ni, Sn, or another metal and is a conformal layer disposed on additional selected surfaces of the capping substrate.

In some embodiments, the conductive layer 222 may be comprised of polysilicon or a similar material. In some embodiments the dielectric layer 224 may be comprised of metal oxides and compounds such as, for example, silicon oxide, silicon carbide, silicon nitride, SRO, some other dielectric, or any combination of the foregoing. In some embodiments, the conductive layer 222 and dielectric layer 224 are of the same materials and formed concurrently with the polysilicon liner 216 and the first and second dielectric layers 214 and 218 surrounding the silicon pillar 210.

Figure 3C:
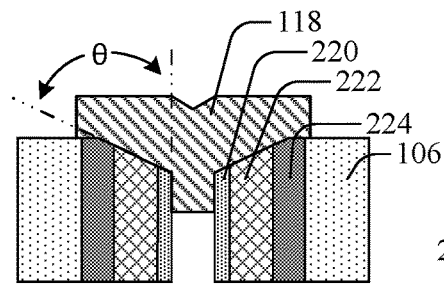

As shown in FIG. 3C, in some embodiments the interface between the cap 118 and the lining structure 116 may comprise and angled or a curvilinear topology. During fabrication, certain processing steps are carried out to remove unwanted deposition of the metal, conductive, or dielectric layers which may overlay the top of the vent 114. The removal of such unwanted depositions may erode the upper surface of these layers resulting in an angled or curved surface topology. As shown, the angle θ approximately describes an angled interface between the lining structure and the cap. As the cap 118 may be formed by a deposition process, the cap 118 will conform to the angled or curvilinear surface of the lining structure. In some embodiments, the angle θ may be between about 15 degrees and about 90 degrees.

Figure 3D:
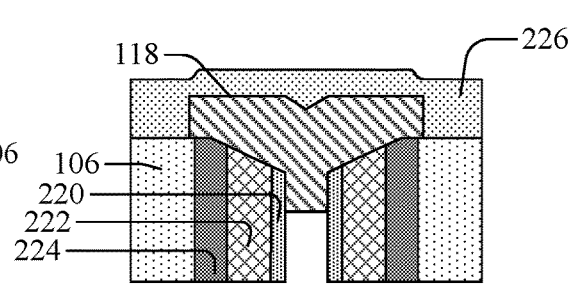

As shown in FIGS. 3A-3C, in some embodiments, the cap 118 alone may effect a seal of the upper extent of the vent 114. In some embodiments, as shown in FIG. 3D, one or more additional layers 226, which may comprise, for example, a passivation layer, a barrier layer, or a metal layer, may overlie the cap 118 to effect an improved seal of the second cavity C2, or for other purposes. In some embodiments the additional layer 226 may comprise the same or different materials as used for the metal layer, the conductive layer, and the dielectric layer. Utilization of metal for the additional layer 226 improves the reliability of the hermetic sealing and helps to achieve stable and higher level hermetic sealing. This is because metal material has a better permeability performance (roughly smaller than 10-14 g/cm×Torr) than other organic/inorganic materials. For example, permeability of organic polymers is in a range of about 10-8-10-12 g/cm×Torr.

Returning to FIG. 2, the second cavity C2 comprises the vent 114. The vent 114 extends vertically through the capping substrate 106 to allow the second cavity C2 to exchange gas with an ambient environment during processing. The vent 114 permits a second gas pressure P2 to be contained within the second cavity C2, and to be independently adjusted relative to a first gas pressure P1 contained within the first cavity C1. Once the gas exchange is complete, the cap 118 is arranged within the vent 114 to hermetically seal the second cavity C2.

Sidewalls of the vent 114 can be either perpendicular or tilted. In some embodiments, the vent 114 is configured to be open at a lower surface of the capping substrate and along sidewalls of the vent, and to be sealed by the cap 118 at an upper surface of the capping substrate. In some embodiments, the vent 114 has a width in a range of about 0.3 to about 3 µm. In some embodiments, fluid communication between the vent 114 and the cavity C2 is by a lateral channel disposed between a lower surface of the capping substrate and an upper surface of the device substrate 102. In some embodiments, an upper surface of the MEMS substrate 206 serves as an upper surface of the device substrate.

In some embodiments, the first cavity C1 is hermetically sealed by bonding pads 208 (which may be configured as bonding rings), and filled with a first gas at a first gas pressure P1 which is accomplished in-situ with the bonding process. In some embodiments, the first gas pressure P1 is atmospheric pressure. In some embodiments, the second cavity C2 is hermetically sealed by the same bonding process. In subsequent processing steps, the vent 114 is opened exchanging the first gas at pressure P1 with a second gas at a second gas pressure P2 which is different than the first gas pressure P1. Installation of the cap 118 then hermetically seals the second cavity C2 containing the second gas pressure P2. In some embodiments, the cap 118 is configured to span and seal the vent and at an upper surface of the capping substrate. In some embodiments, the second gas pressure P2 is a vacuum in comparison to atmospheric pressure.

By independently controlling the pressures within the first and second cavities C1 and C2, performance of the MEMS package 200 can be improved. For example, performance of a motion sensor having a first MEMS device 104A including an accelerometer, and a second MEMS device 104B including a gyroscope can be increased by independently controlling the pressures associated with each device. The gyroscope is often packaged in a vacuum for optimal performance, while the accelerometer is often packaged at a predetermined pressure (e.g., 1 atmosphere) to produce a smooth frequency response. The ability to independently adjust gas pressure in the first and second cavities optimizes the function of the first MEMS device 104A and second MEMS device 104B (i.e., the accelerometer and the gyroscope).

Referring again to FIG. 2, the MEMS package described with the sealing structure and the silicon pillar may be utilized in wafer level chip scale package (WLCSP) technology (e.g., which packages an integrated chip at a wafer level, rather than after singulation) to lower fabrication costs and to achieve a smaller substrate size. As noted, the device substrate includes an interconnect layer to provide for electrical routing (e.g., lateral routing) to input/output (I/O) connection points of semiconductor devices within the semiconductor substrate 202. By providing a conductive path from the MEM substrate to the top surface of the capping substrate 106, the silicon pillar enables the MEMS package 200 to be manufactured by way of the WLCSP technology. This is because the low resistance silicon pillar allows for an electrical connection between the MEM substrate and external circuits without additional packaging operations. For example, the silicon pillar allows for an external connection (e.g., a wire bonding or flip chip solder ball) to be formed on the upper surface of the capping substrate 106 (e.g., on top of the silicon pillar 210) prior to singulation of the device substrate 102. A solder ball (not shown) may be arranged onto a top of the silicon pillar to provide a connection point between the silicon pillar and an external circuit (e.g., a system level printed circuit board (PCB)), to which the capping substrate 106 may be mounted after chip dicing.

Thus, the subject disclosure solves a fundamental problem associated with efficiently fabricating smaller footprint MEMS devices by exploiting WLCSP technology. In particular, the solution allows for multi-cavity MEMS devices to be integrated at the wafer level, while providing for independent pressure adjustment in different MEMS cavities, thus optimizing the individual performance of each MEMS device.

With reference to FIGS. 4-21, a series of cross-sectional views 400-1200 illustrate some embodiments of a method for manufacturing the wafer to wafer bonded MEMS device disclosed herein. Although FIGS. 4-21 are described in relation to a method of manufacturing, it will be appreciated that the structures disclosed in FIGS. 4-21 are not limited to the method, but instead may stand alone as structures independent of the method. Similarly, although the method is described in relation to FIGS. 4-21, it will be appreciated that the method is not limited to the structures disclosed in FIGS. 4-21, but instead may stand alone independent of the structures disclosed in FIGS. 4-21.

Figure 4:
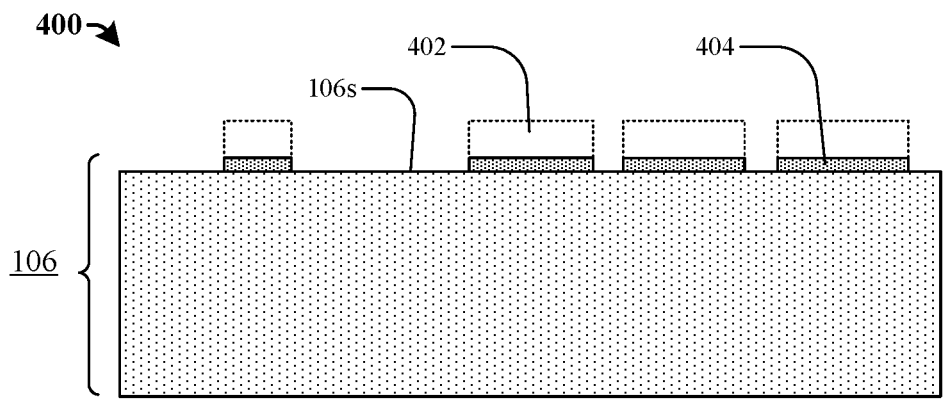
FIGS. 4-21 illustrate a series of cross-sectional views of some embodiments of a MEMS package at various stages of manufacture.

FIG. 4 illustrates some embodiments of a cross-sectional view 400 showing the formation of the hard mask 404 disposed on the upper surface 106s of the capping substrate 106. A dielectric material (e.g. silicon nitride, silicon oxide, silicon carbide or the combination thereof) on the upper surface 106s of the substrate, and then selectively patterned using mask 402 to form the hard mask 404 shown. Patterning of the dielectric material to leave the hard mask 404 involves photolithography and etching. In some embodiments, deposition of the dielectric material involves chemical vapor deposition (CVD), sputtering, or other appropriate deposition process.

Figure 5:
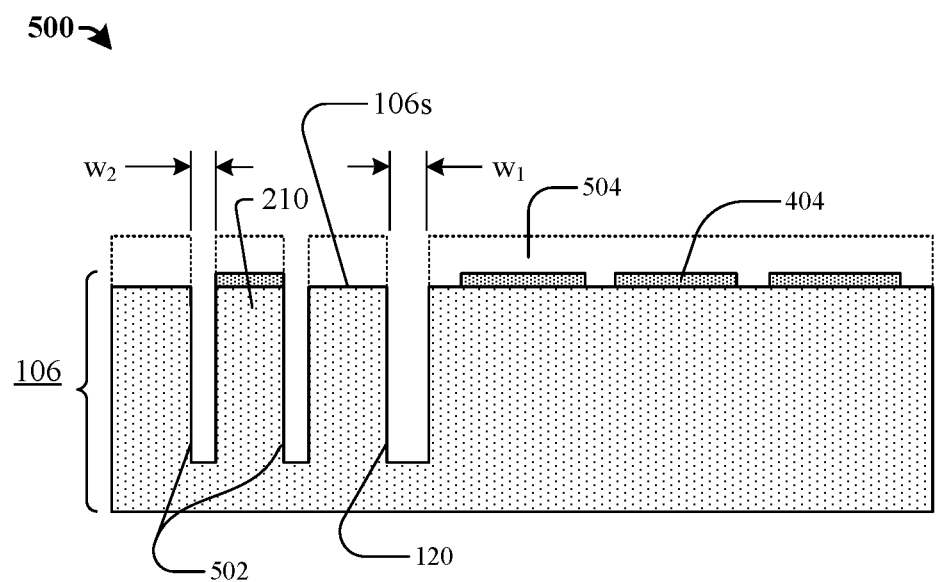

FIG. 5 illustrates some embodiments of a cross-sectional view 500 showing the formation of the isolation trenches 502 and the ventilation trench 120 within the capping substrate 106. Isolation trenches 502 and ventilation trench 120 have been formed through photolithography and etching of the upper surface 106s of the capping substrate 106. The isolation trenches 502 are laterally spaced apart with a silicon pillar 210 disposed between the trenches. In some embodiments, a photoresist (PR) mask 504 is first formed over the upper surface 106s. In some embodiments, a vertical etch process is carried out to simultaneously produces the isolation trenches 502 and also to form the ventilation trench 120. In some embodiments, the width $w_1$ of the ventilation trench 120 is wider than the width $w_2$ of the isolation trenches 502 to provide additional space for the sealing structure 112 to be formed within the ventilation trench 120 (referring to FIG. 17, for example), and still leave an adequate opening for the vent 114. In some embodiments, a first etch process may form the isolation trenches 502, while a separate, second etch may form the ventilation trench 120 in order to prevent contamination of the ventilation trench 120 during the formation of the isolation trenches 502. In some embodiments, the depth of the isolation trenches 502 and the ventilation trench 120 is controlled by a timed etch process, with the process terminating after a set period of time indicating the desired depth of the trenches has been achieved. Following formation of the trenches, the PR 504 mask is stripped.

Figure 6:
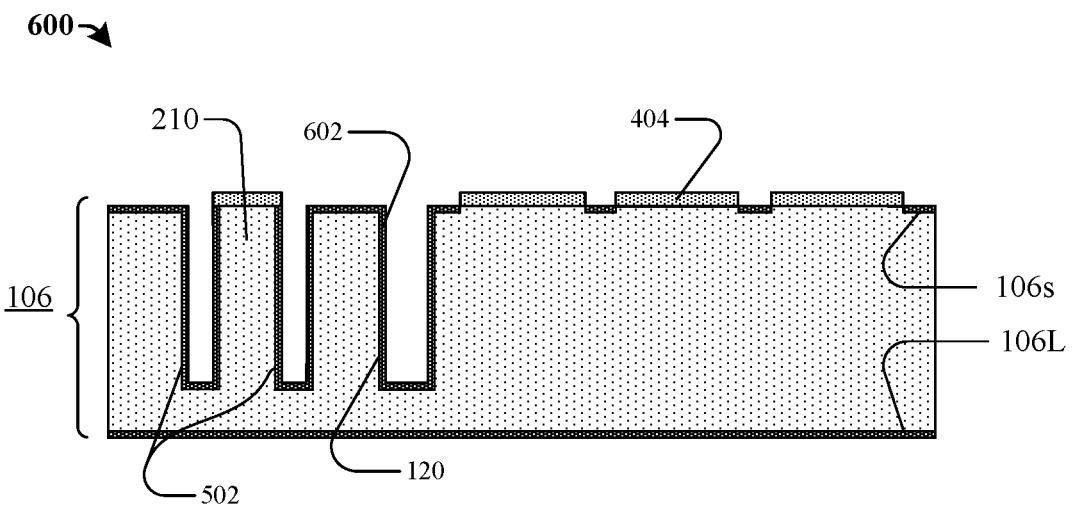

FIG. 6 illustrates some embodiments of a cross-sectional view 600 showing the formation of the oxide layer 602 on the upper surface 106s and the lower surface 106L of the capping substrate 106, and along the inner walls of the isolation trenches 502 and the ventilation trench 120. In some embodiments, the oxidation layer is formed by thermal oxidation of the capping substrate in a furnace environment. The oxidation layer does not form on areas of the capping substrate that are covered by the hard mask 404.

Figure 7:
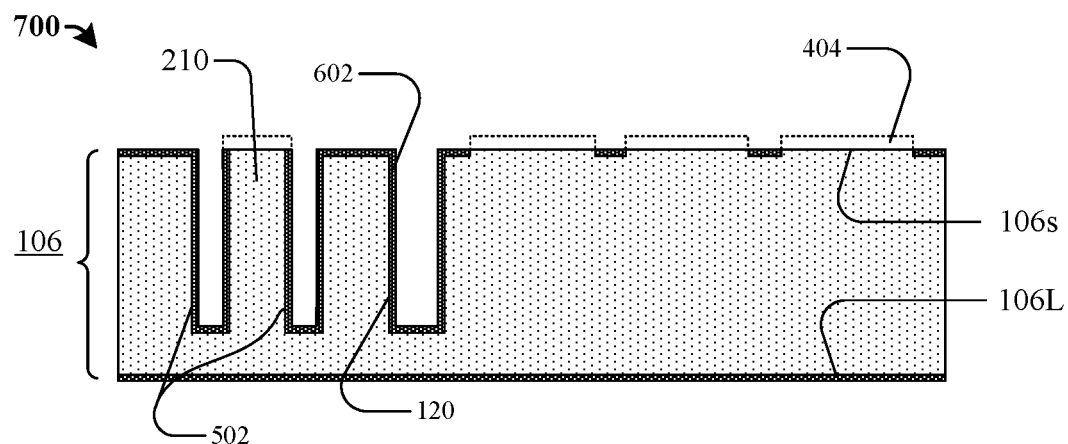

FIG. 7 illustrates some embodiments of a cross-sectional view 700 showing the removal of the hard mask 404 from the upper surface 106s of the capping substrate 106. In FIG. 7, the hard mask 404 have been removed, revealing the underlying and non-oxidized upper surface 106s of capping substrate 106. In various embodiments, removal of the deposited SiN regions is accomplished by a reactive ion etching (RIE) process, or a selective etch.

Figure 8:
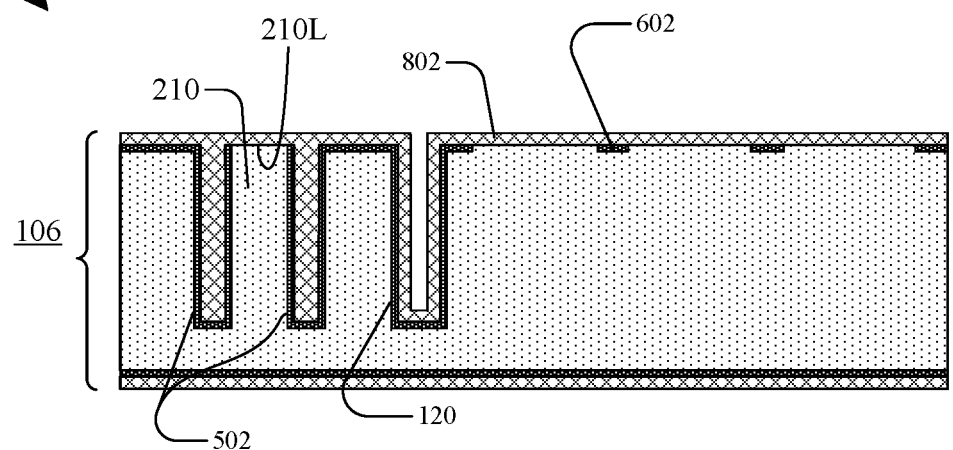

FIG. 8 illustrates some embodiments of a cross-sectional view 800 showing the formation of the polysilicon layer 802 over the upper surface 106s and over the lower surface 106L of the capping substrate 106. The formation of the polysilicon layer 802 fills the isolation trenches 502 and lines the sidewalls of the ventilation trench 120 but does not close the ventilation trench 120. The polysilicon layer 802 also forms directly over the surface 210L of the polysilicon pillar 201. In this fashion, electrical coupling is established between the polysilicon layer 802 and the silicon pillar 210 at its surface 210L. In some embodiments, the polysilicon deposition may be carried out under timed conditions such that the deposition thickness grows adequately to fill the isolation trenches 502, yet does not grow to a sufficient thickness to fill the wider ventilation trench 120. In various embodiments, the polysilicon is formed by CVD (e.g., low-pressure CVD (LPCVD) or plasma-enhanced CVD (PECVD)), physical vapor deposition (PVD), or other appropriate process. The polysilicon deposition on the surface 210L of the silicon pillar 210, absent the presence of an oxide layer between the two, electrically couples the polysilicon with the silicon pillar 210.

Figure 9:
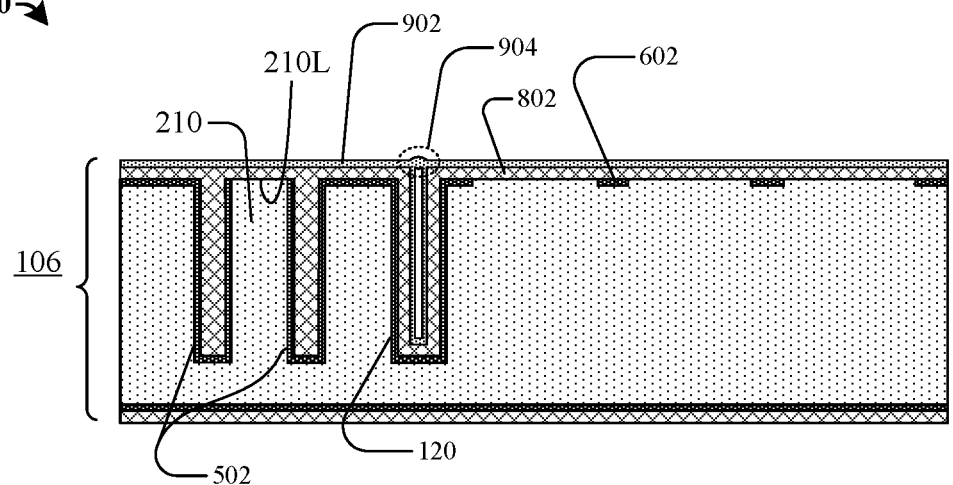

FIG. 9 illustrates some embodiments of a cross-sectional view 900 showing the formation of a metal layer 902 over the polysilicon layer 802. In some embodiments, the metal layer 902 may be deposited through a sputtering or other applicable process achieving the desired thickness control of the deposited metal. The metal layer 902 deposits on the polysilicon layer 802 above the filled isolation trenches, and deposits on the polysilicon layer 802 lining but not closing the an opening along the sidewalls of the ventilation trench 120. In some embodiments, the metal deposition is conducted in a two-step process, the first step being a time-controlled process limiting the thickness of the deposited metal such that an opening remains within the ventilation trench 120, thus defining the vent 114. In the second metal deposition step, a metal layer is deposited at a faster rate causing the deposited metal to from a metal overhang 904 over the top of the vent 114 and effect a seal of the vent 114.

The faster deposition rate and ambient conditions of the second metal deposition step causes the metal to span across the opening at the top of the vent 114, rather than to fill the vent 114 by depositing on the sidewalls of the vent 114. In some embodiments, the same metal is used for both the first and second deposition steps, with the deposition process conditions being varied to effect higher or lower metal thickness growth rates.

Figure 10:
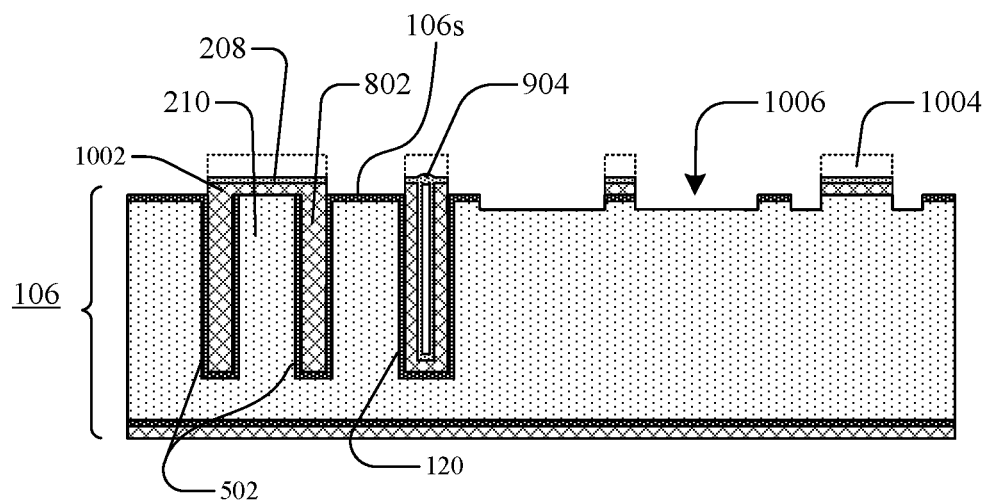

FIG. 10 illustrates some embodiments of a cross-sectional view 1000 showing the patterning and etching of the metal layer 902 and polysilicon layer 802. The metal layer 902 and the polysilicon layer 802 have then been patterned using the mask 1004 through photolithography process and etching process to form the polysilicon stand-off 1002. The polysilicon stand-off 1002 extends above the upper surface 106s of the capping substrate 106. The polysilicon stand-off 1002 is formed over the silicon pillar 210 and provides an electrical conduction path to the silicon pillar 210. The metal layer 902 has been similarly patterned such that a bonding pad 208 is arranged over the polysilicon stand-off 1002 and configured to form part of a eutectic bond between the capping substrate 106 and a subsequently bonded device substrate 102. Also in FIG. 10, the etching process that selectively removes portions of the metal layer 902 and polysilicon layer 802 also etches into the capping substrate 106 in locations 1006 not shielded by the photoresist mask or by the previously formed oxide layer 602, and begins to form the first and second recessed regions 108 and 110.

Figure 11:
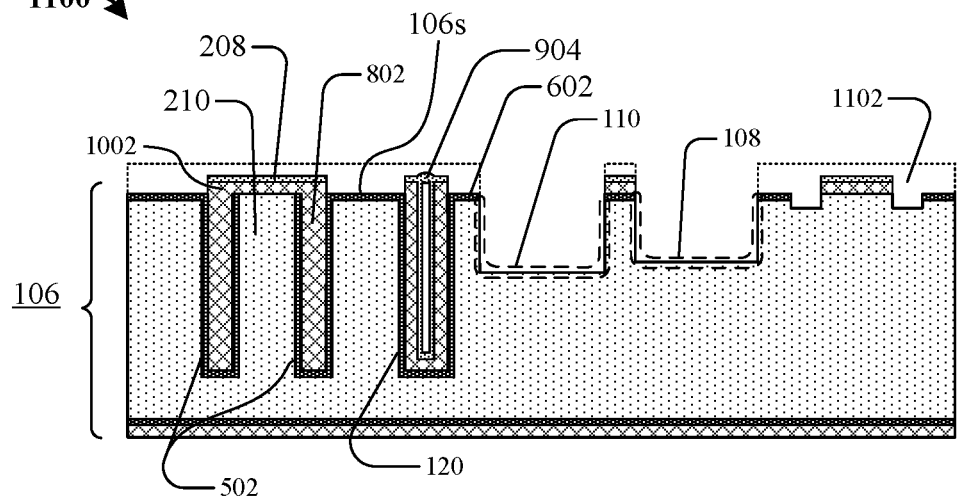

FIG. 11 illustrates some embodiments of a cross-sectional view 1100 showing the formation of the first and second recessed regions 108 and 110. The first recessed region 108 and the second recessed region 110 have been etched using the mask 1102 to their full intended depth within the capping substrate 106. In some embodiments, a dry or a wet etch process may be employed to achieve the desired depths of the first and second recessed regions 108 and 110. In some embodiments, the etching of the first and second recessed regions 108 and 110 may be accomplished in a single, time-limited process step to achieve the desired depth of the recessed regions which will be about the same depth, and this process may be achieved concurrently with selectively etching away of the metal layer 902 and polysilicon layer 802. In some embodiments, the etching may be accomplished in separate steps subsequent to etching away the metal layer 902 and polysilicon layer 802. In the first separate step, a time-limited etching process may be applied to achieve about equal depths of the first and second recessed regions 108 and 110. In an optional second separate step, one recessed region may be masked and an additional etch performed to achieve a deeper depth of the other recessed region, resulting in different depths of the first and second recessed regions 108 and 110 as illustrated. Such a multi-step process may be uniquely suited to multi-cavity MEMS devices that may be individually optimized by sizing their specific cavity volume.

Figure 12:
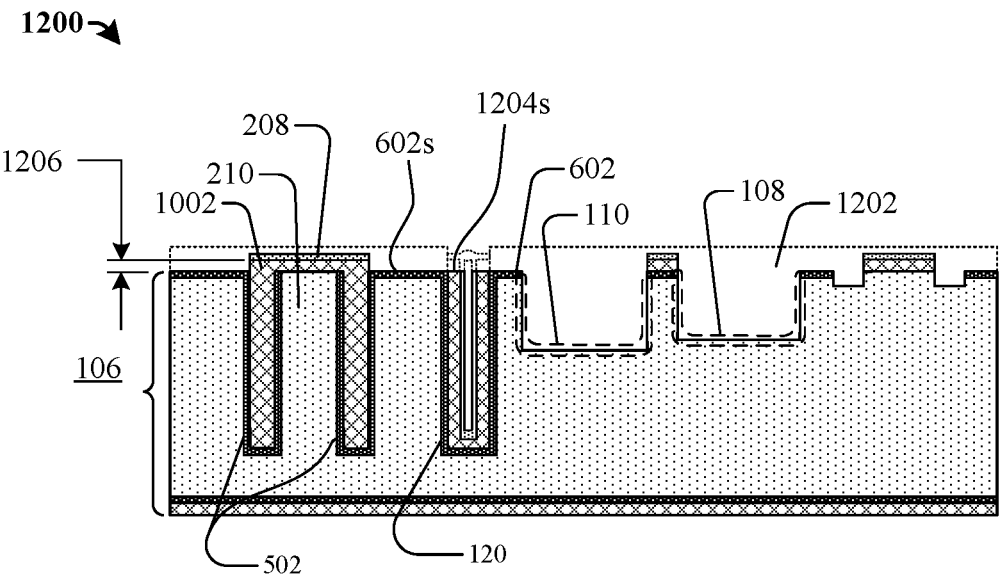

FIG. 12 illustrates some embodiments of a cross-sectional view 1200 of a process for opening the vent 114. In FIG. 12, a hard mask 1202 is first formed over the capping substrate 106 and patterned to expose the metal overhang 904 and polysilicon material directly over the ventilation trench 120 and above the upper surface 602s of the oxide layer 602. In a series of materially selective etching steps, the metal overhang 904 and the polysilicon material are progressively removed until their upper surfaces 1204s are approximately even with or just below the upper surface 602s of the surrounding oxide layer 602. Once bonded to the device substrate 102 in a subsequent step, a fluid channel will be open to the second recessed region 110 via the offset 1206 in height between the upper surface of the polysilicon stand-off 1002 and the upper surface 602s of the oxide layer 602. In a subsequent materially selective dry etch process, the hard mask is removed.

Figure 13:
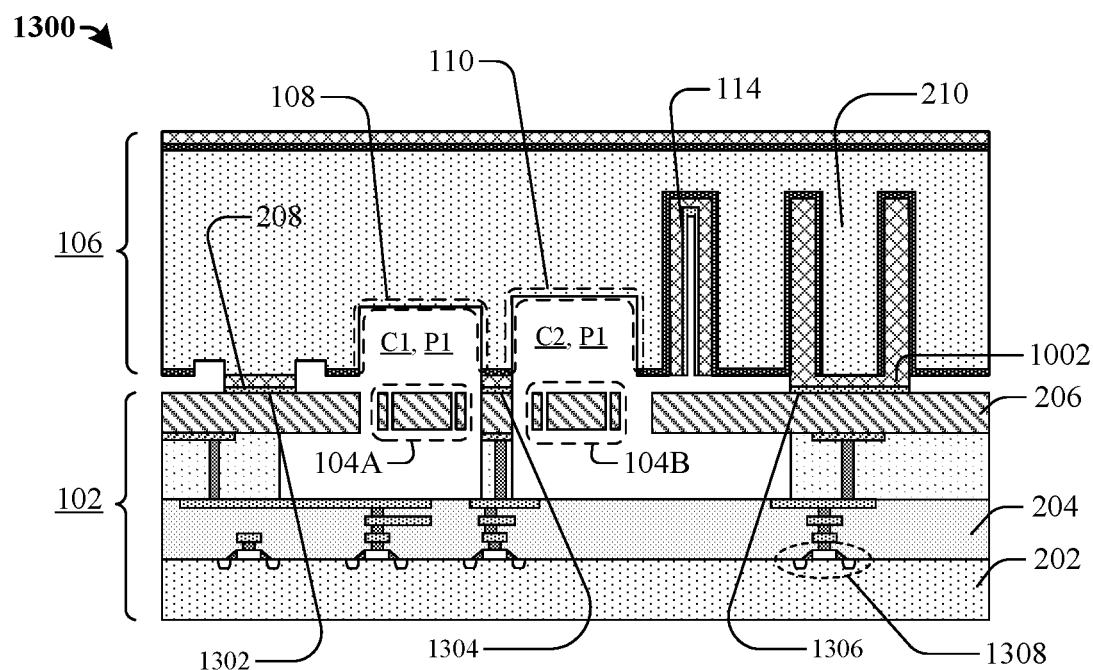

FIG. 13 illustrates some embodiments of a cross-sectional view 1300 showing the bonding of the capping substrate 106 to the device substrate 102. In FIG. 13, the capping substrate 106 has been flipped about a horizontal axis and rotated about a vertical axis to align with the device substrate 102. The device substrate 102 may comprise a MEMS substrate 206, an interconnect layer 204 having metallization planes and vias disposed within an inter-metal dielectric (IMD) material, and a semiconductor substrate 202 having active elements (e.g., a transistor). In some embodiments, the MEMS substrate 206 comprises a first MEMS device 104A and a second MEMS device 104B, the MEMS devices being disposed in a horizontal plane. In some embodiments, the MEMS substrate 206 is electrically coupled to the first MEMS devices 104A and the second MEMS device 104B which are electrically coupled to the interconnect layer 204. The interconnect layer 204 is electrically coupled to active elements 1308 within the semiconductor substrate 202. In this fashion the first MEMS device 104A and second MEMS device 104B are electrically coupled to active elements of the semiconductor substrate 202.

Again referring to FIG. 13, the capping substrate 106 is aligned and bonded to the device substrate 102 by use of the bonding pads 208, which may comprise a metal. The first and second recessed regions 108 and 110 are aligned with the device substrate 102 such that the bonding action defines a first sealed cavity C1 that is associated with the first MEMS device 104A and the first recessed region 108, and a second cavity C2 that is associated with the second MEMS device 104B and the second recessed region 110.

In some embodiments, the bonding pads 208 comprise a metal and the bonding between the capping substrate 106 and the device substrate 102 action may comprise a eutectic bond. In some embodiments, the bonding action effects an electrical connection from silicon pillar 210 the to the MEMS devices and thus to the active elements of the semiconductor substrate 202.

In some embodiments, the eutectic bond comprises semiconductor-to-metal bonding between a semiconductor material and a metal material. In some embodiments, the semiconductor material includes at least one of Ge, Si, SiGe or another semiconductor material. In some embodiments, the metal material includes at least one of Al, Cu, Ti, Ta, Au, Ni, Sn, or another metal. In some embodiments, the eutectic bond comprises metal-to-metal bonding between two metal materials each including at least one of Al, Cu, Ti, Ta, Au, Ni, Sn, or another metal. In some embodiments, the bond is formed by pressing the materials to be bonded together against each other in an annealing process to form a eutectic phase of the materials. For example, a eutectic binding between Ge and Al is formed at an annealing temperature in a range from 400° C. to 450° C.

Again referring to FIG. 13, the bonding action forms a first hermetic seal 1302 and a second hermetic seal 1304 with respect to the first cavity C1, and captures the first gas and first pressure P1 of the bonding furnace within the first cavity C1. In some embodiments, the first pressure P1 may be atmospheric pressure. The second hermetic seal 1304 serves also as a seal boundary for the second cavity C2, and along with the third hermetic seal 1306 defines the second cavity C2. The bonding action similarly captures the same gas and pressure P1 within the second cavity C2.

Examples of hermetic seals include thermal compressive bonding, fusion bonding, and eutectic bonding with one or more bonding materials. In a subsequent processing step, the vent 114 which is in fluid communication with the second cavity C2, may be opened to exchange the first gas in the second cavity C2 for a second gas, and/or to exchange the first pressure P1 for a second pressure P2. In this manner, the gas and pressure of the cavities may be independently adjusted and optimized for each MEMS device.

The third hermetic seal 1306 is accomplished at the bonding interface below the silicon pillar 210. This third hermetic seal 1306 serves the additional purpose of electrically coupling the silicon pillar 210, through the polysilicon stand-off 1002, to the MEMS substrate 206 and, thus, electrically coupling the silicon pillar 210 to the active elements 1308 of the semiconductor substrate 202. In this fashion, the silicon pillar 210 provides an electrical conduction path from the semiconductor devices, through the MEMS devices, and through a seal boundary of the second cavity C2 and to an upper surface 106s of the capping substrate 106.

In some embodiments, the silicon pillar 210 is a semiconductor material doped to be conductive material relative to the capping substrate 106, which may also comprise a semiconductor material. In various embodiments, the capping substrate 106, the silicon pillar 210, and the device substrate 102 comprise an elementary semiconductor, a compound semiconductor, or an alloy semiconductor. Examples of elementary semiconductors include, but are not limited to, one or more of silicon and germanium. Examples of compound semiconductors include, but are not limited to, one or more of silicon carbide, gallium arsenide, gallium phosphide, indium phosphide, indium arsenide, and indium antimonide. Examples of alloy semiconductors include, but are not limited to, one or more of SiGe, GaAsP, AlInAs, AlGaAs, GaInAs, GaInP, and GaInAsP.

Figure 14:
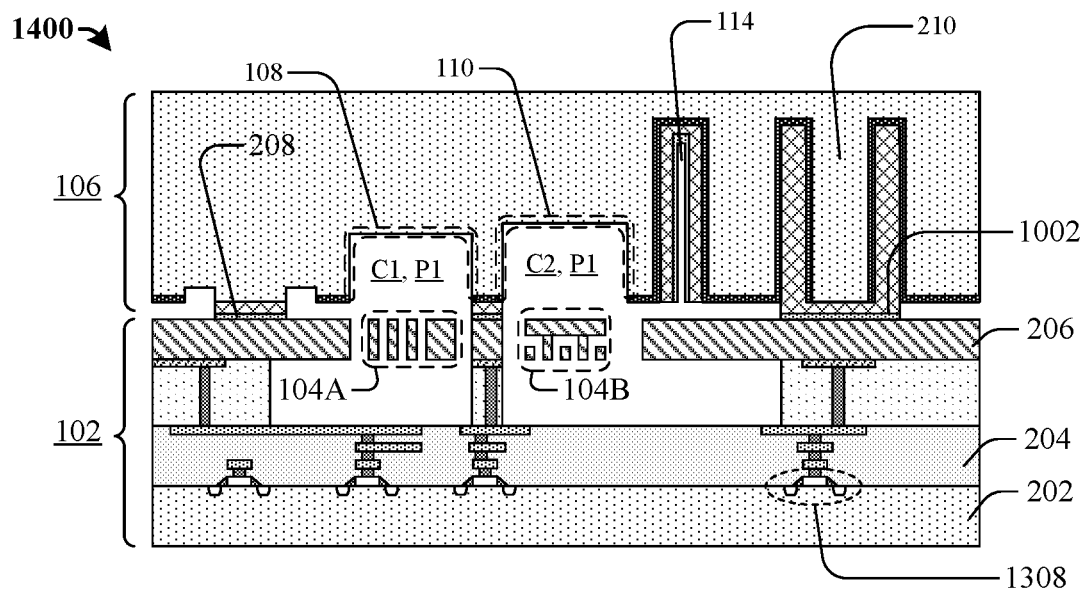

FIG. 14 illustrates some embodiments of a cross-sectional view 1400 showing the thinning down the capping substrate 106, after being bonded to the device substrate 102. The capping substrate 106 is thinned down to remove a partial thickness from the non-bonded surface of the capping substrate 106. The thinning of the capping substrate 106 serves to remove selected portions of the metal layer 902 and the polysilicon layer 802 accumulated on the former lower surface of the capping substrate, now the non-bonded surface after having been flipped. In some embodiments, an additional thickness may be removed beyond removal of the polysilicon layer 802, but not so much as to affect opening of the vent 114 and thereby introducing contaminants into the vent 114 or the second cavity C2. In some embodiments, the thinning of the capping substrate 106 may be accomplished, for example, by a chemical mechanical planarization (CMP) process.

Figure 15:
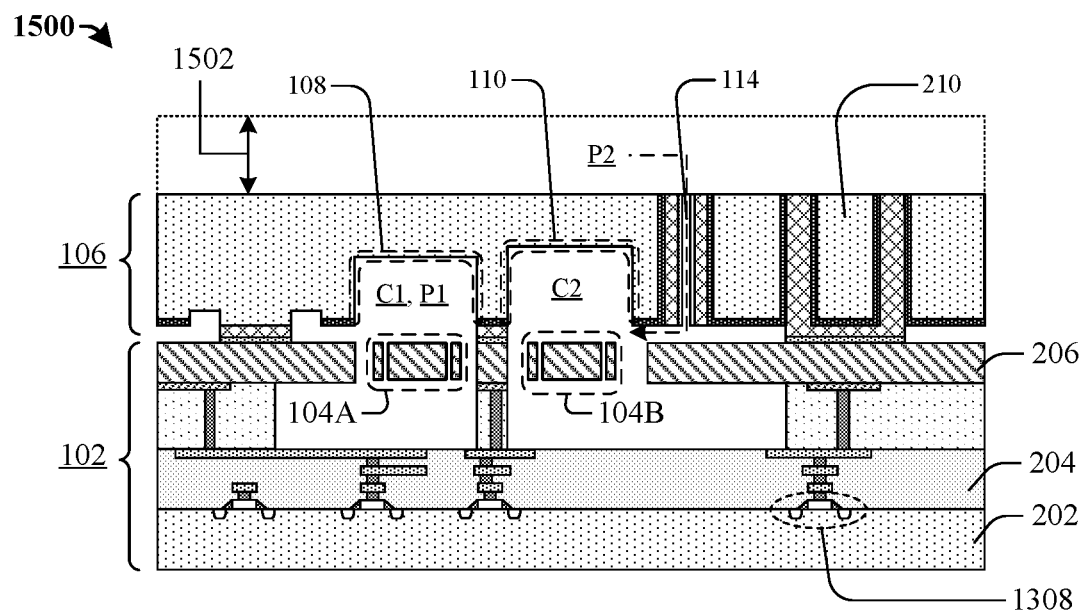

FIG. 15 illustrates some embodiments of a cross-sectional view 1500 showing the step of further thinning down the capping substrate 106 by a thickness 1502 to effect opening the vent 114. This thin down process may be accomplished by a dry-etch back process, for example using a plasma of reactive gases such as fluorocarbons, oxygen, chlorine, and boron trichloride, sometimes with addition of nitrogen, argon, helium and other gases. Dry etching has the advantage of mitigating the generation of contaminants that may occur when using with a wet etching process and that may restrict the vent 114 or contaminate the second cavity C2 and the second MEMS device 104B.

Upon opening of the vent 114, the first gas and first pressure P1 contained within the second cavity C2 is exchanged with the second gas and the second pressure P2 of the ambient environment. In some embodiments, the exchange of the gasses is accomplished in situ. For example, the gas pressure within the processing chamber is maintained at the first gas pressure P1 throughout the processing steps illustrated in FIGS. 4-14. Then, after opening the vent 114 as illustrated in FIG. 15, the gas pressure P1 within the processing chamber is adjusted to the ambient and second gas pressure P2 of the process step illustrated in FIG. 15. Gas diffusion is allowed to occur through the vent 114 between the ambient environment of process step FIG. 15 and the second cavity C2. Once the gas diffusion reaches a steady-state condition, the gas pressure within the second cavity C2 is equal to the second gas pressure P2, which is different than the first gas pressure P1. In some embodiments, the second gas pressure P2 is a vacuum relative to atmospheric pressure.

Figure 16:
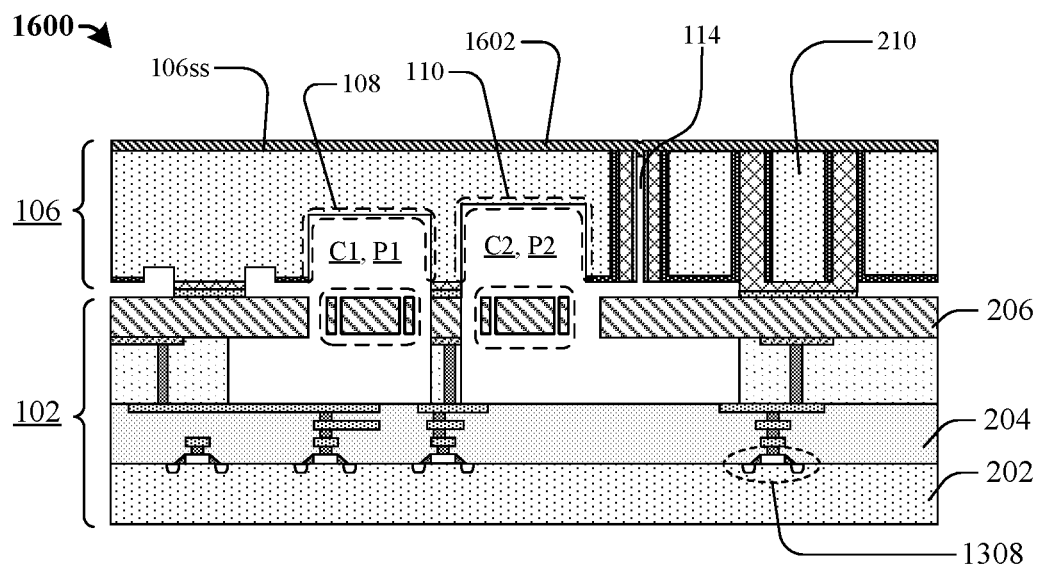

FIG. 16 illustrates some embodiments of a cross-sectional view 1600 showing the step of sealing the vent 114 with a cap 118 and thus hermetically sealing the second cavity C2 at the second gas pressure P2. A conformal layer of cap material 1602 has been disposed over the upper surface 106ss of the capping substrate 106. In various embodiments, the cap material comprises SiN, SiON, oxide, photoresist (PR), polyimide, amorphous carbon (a-C), polysilicon, amorphous silicon (a-Si), metal (e.g. AlCu etc.) epoxy, or other suitable material. The suitability of the cap material is determined by several factors, including, but not limited to, the material used to form the capping substrate 106 and the second gas pressure within the second cavity C2. For a second gas pressure of less than about 3 torr, the cap material 1602 may comprise a metal film (e.g., formed via sputtering). For a second gas pressure in a range of about 3 torr to about 100 torr the cap material 1602 may comprise oxide, SiN, SiON, or a-C (e.g., formed via CVD). For a third gas pressure in a range of about 100 torr to about 500 torr the cap material 1602 may comprise polysilicon. For a fourth gas pressure in a range of about 500 torr to about 1,000 torr the cap material 1602 may comprise PR, polyimide or epoxy (e.g., formed via a UV cure technique)

Figure 17:
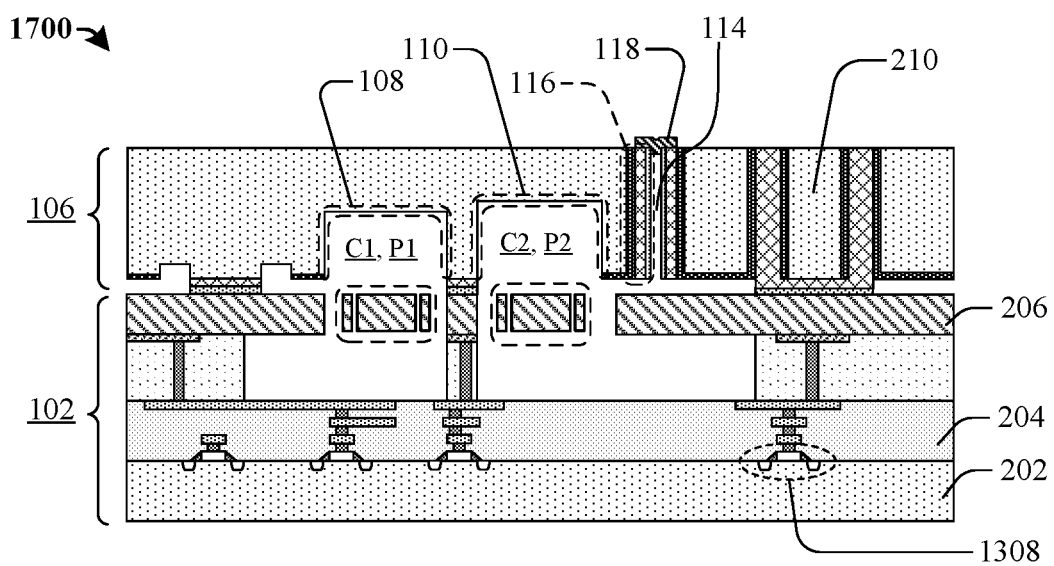

FIG. 17 illustrates some embodiments of a cross-sectional view 1700 showing the cap material 1602 (shown in FIG. 16) has been patterned to form the cap 118. The cap 118 is arranged over a portion of the lining structure 116 and extends into and spans the width of the vent 114. In some embodiments, as shown in FIGS. 3A and 3B, the cap 118 may span the width of the metal layer 220, or it may also span the width of the conductive layer 222, or it may also span the width or beyond the width of the dielectric layer 224. The cap 118 forms a hermitic seal with the lining structure 116 to seal the second cavity C2 at the second gas pressure P2 that is different than the first gas pressure P1 in the first cavity C1. For some embodiments, the vent 114 is narrow enough that adhesive forces between surfaces of the cap 118 and surfaces of the lining structure 116, as well as the surface tension of the material that forms the cap 118, prevent the material from "falling through" the vent 114 and contaminating the second cavity C2 and the second MEMS device 104B.

Figure 18A:
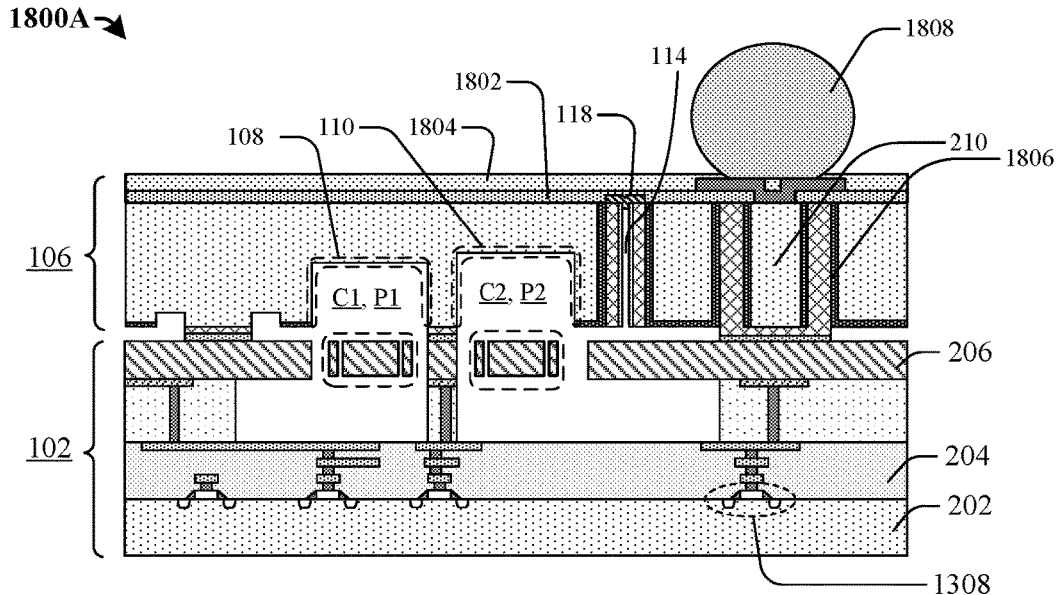

FIG. 18A illustrates some embodiments of a cross-sectional view 1800A showing the formation of a conformal or a passivation layer 1802 over the cap 118 to enhance the sealing capability of the cap 118. In some embodiments, the conformal or passivation layer 1802 is a metal layer. In some embodiments, an insulating layer 1804, for example an oxide layer, may be disposed over the conformal or passivation layer 1802. In some embodiments, a conductor 1806 may be formed over and in electrical contact with the silicon pillar 210, and a solder ball 1808 may be formed overlying the conductor. In this manner, the solder ball 1808 provides electrical connectivity from points exterior to the MEMS package 200, by way of the silicon pillar 210, to the MEMS substrate 206 and to the active elements 1308 of the semiconductor substrate 202.

By providing a conductive path from the MEMS substrate 206 to exterior of the MEMS package 200, the silicon pillar 210 enables the MEMS package 200 to be manufactured by way of the WLCSP technology without additional packaging operations. Thus, the present disclosure solves a fundamental problem associated with fabricating cost effective and smaller footprint MEMS devices by exploiting WLCSP technology. In particular, the solution allows for multi-cavity MEMS devices to be integrated at the wafer level, while providing for independent pressure adjustment in different MEMS cavities, thus optimizing the individual performance of each MEMS device.

Figure 18B:
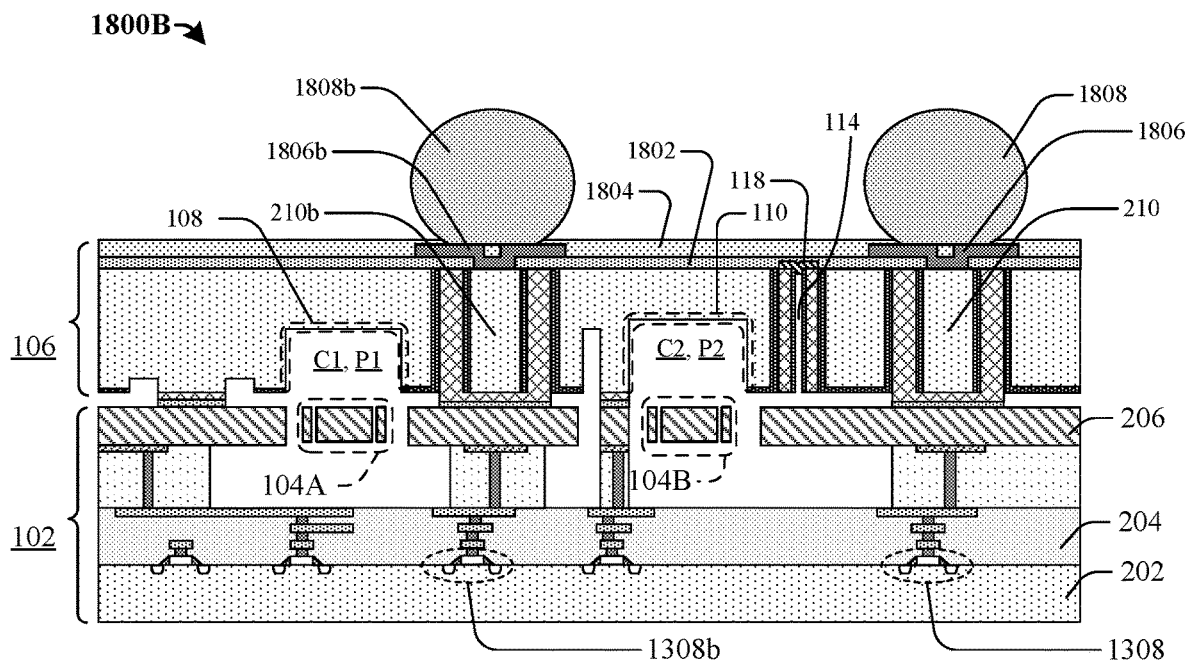

FIG. 18B illustrates an additional embodiment, where a second silicon pillar 210b may be fabricated through the capping substrate 106 and is associated with the first cavity C1 and the first MEMS device 104A, as compared the silicon pillar 210 which is associated with the second cavity C2 and the second MEMS device 104B. The second silicon pillar 210b may be fabricated in the same manner as the silicon pillar 210. In some embodiments, the second silicon pillar 210b may affect a seal of the first cavity C1, and may electrically couple through the MEMS substrate 206 to second active elements 1308b. After forming the second silicon pillar 210b, a second conductor 1806b may be formed over and in electrical contact with the second silicon pillar 210b, and a second solder ball 1808b may be formed overlying the second conductor 1806b. In this manner, the second solder ball 1808b provides an electrical connection from points exterior to the MEMS package 200, by way of the second silicon pillar 210b to the second active elements 1308b. In some embodiments, the second silicon pillar 210b may be formed simultaneously with the forming of the silicon pillar 210, and following the methods taught herein as illustrated by FIGS. 5 through 18A, which are not repeated showing the second silicon pillar 201b. Similarly, the embodiment illustrated in FIG. 2 may feature a second silicon pillar 210b associated with the first MEMS device 104A, as illustrated in FIG. 18B.

Figure 19:
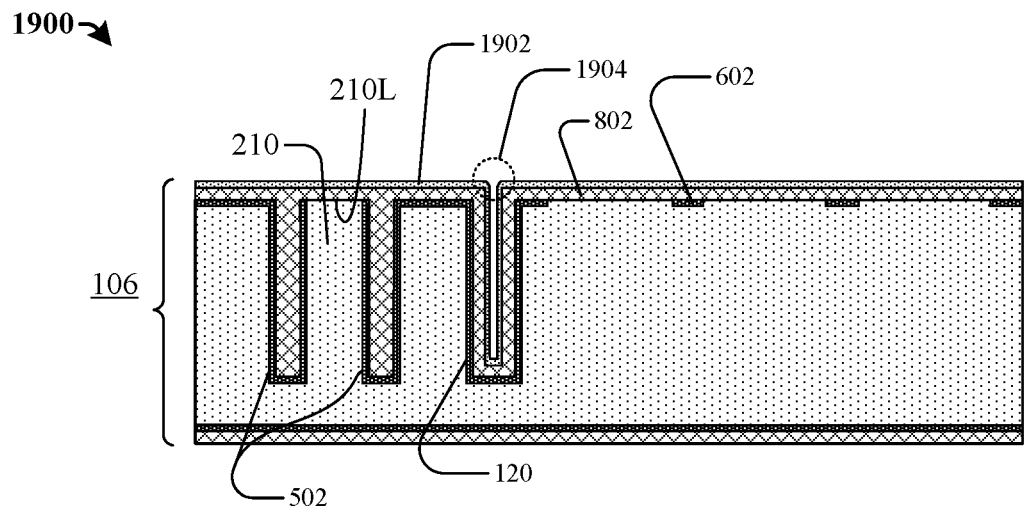

FIG. 19 illustrates some embodiments of a cross-sectional view 1900 showing an alternative embodiment of the manufacturing method, starting with the configuration illustrated in FIG. 8. In FIG. 19, the initial metal layer deposition process is identical to that followed in FIG. 9. However, there is no subsequent metal layer deposition to seal the top of the vent 114. The metal layer deposition process is complete for this step with the initial deposition of metal layer 1902 that lines the vent with metal. The vent 114 is thus left with an opening 1904 at the top of the vent and without the metal overhang 904 that spans the top of the vent 114.

Figure 20:
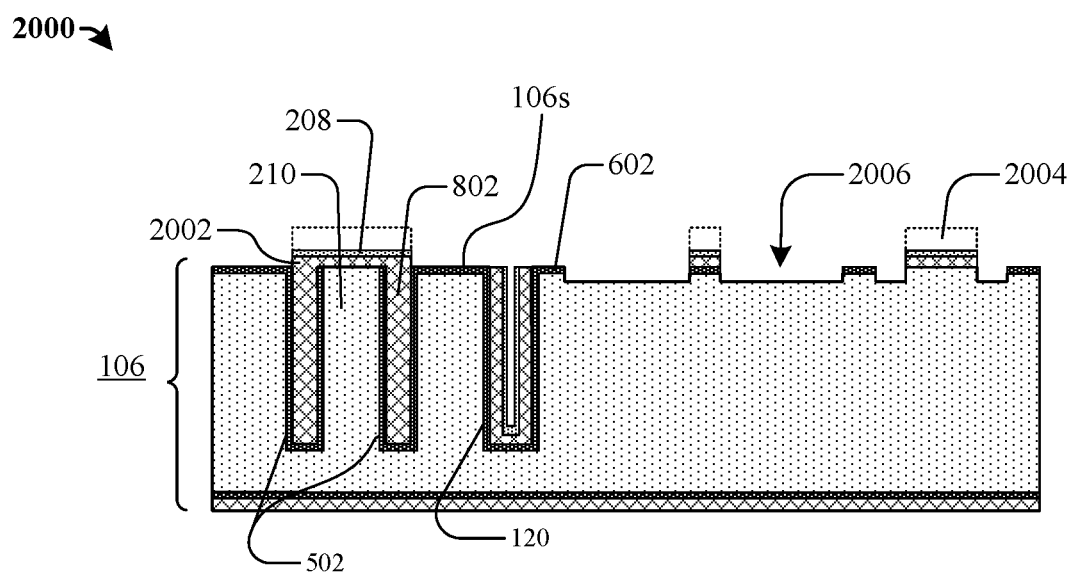

FIG. 20 illustrates some embodiments of a cross-sectional view 2000 showing the patterning of the metal layer 902 and the polysilicon layer 802. These layers have been patterned using the mask 2004 and etched to form the polysilicon stand-off 2002 that extends above the upper surface 106s of the capping substrate 106. The polysilicon stand-off 2002 is arranged over and in direct contact the silicon pillar 210 and serves as electrical conduction path in parallel with the silicon pillar 210.

For the etching protocol, a dry etching process may be employed, for example a plasma etching process, as the vent is not covered by a metal overhang and may be susceptible to contamination from a wet etch process. The metal layer 902 and the polysilicon layer 802 have been patterned similarly such that a bonding pad 208 remains from the metal layer 902 and is arranged above the polysilicon standoff 2002. The bonding pad 208 is configured to form part of a eutectic bond between the capping substrate 106 and a subsequently bonded device substrate 102. Also in FIG. 20, the etching process that selectively removes the metal and polysilicon layers also etches into the capping substrate in locations 2006 not shielded by the mask 2004 or by the previously formed oxide layer 602, and begins to form the first and second recessed regions 108 and 110.

Figure 21:
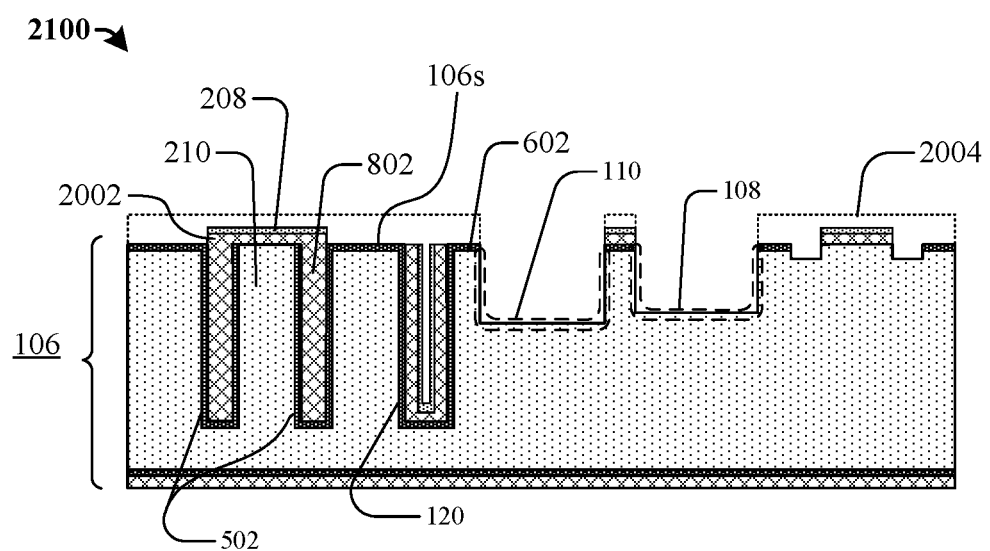

FIG. 21 illustrates some embodiments of a cross-sectional view 2100 showing the etching of the first and second recessed regions 108 and 110 to their full depth within the upper surface 106s of the capping substrate 106. In some embodiments, a dry etch process may be employed to achieve the desired depths of the first and second recessed regions 108 and 110 to avoid contamination of the vent 114 and the second MEMS device 104B. In some embodiments, the etching of the first and second recessed regions 108 and 110 may be accomplished in a single, time-limited process step to achieve the desired depth of the recessed regions which will be about the same depth. In some embodiments, this process may be achieved concurrently with selectively etching away the metal layer 902 and polysilicon layer 802 as depicted in FIG. 20. In some embodiments, the etching may be accomplished in separate steps subsequent to etching away the metal layer 902 and polysilicon layer 802. In the first separate step, a time-limited etching process may be applied to achieve about equal depths of the first and second recessed regions 108 and 110. In an optional second separate step, one recessed region may be masked and an additional etch performed to achieve a deeper depth of the other recessed region, resulting in different depths to the first and second recessed regions 108 and 110 as illustrated. Such a multi-step process may be uniquely suited to multi-cavity MEMS devices that may be individually optimized by sizing their specific cavity volumes and/or heights. Following the configuration depicted in FIG. 21, processing may continue as described earlier according to the methods illustrated in FIGS. 13-18.

Figure 22:
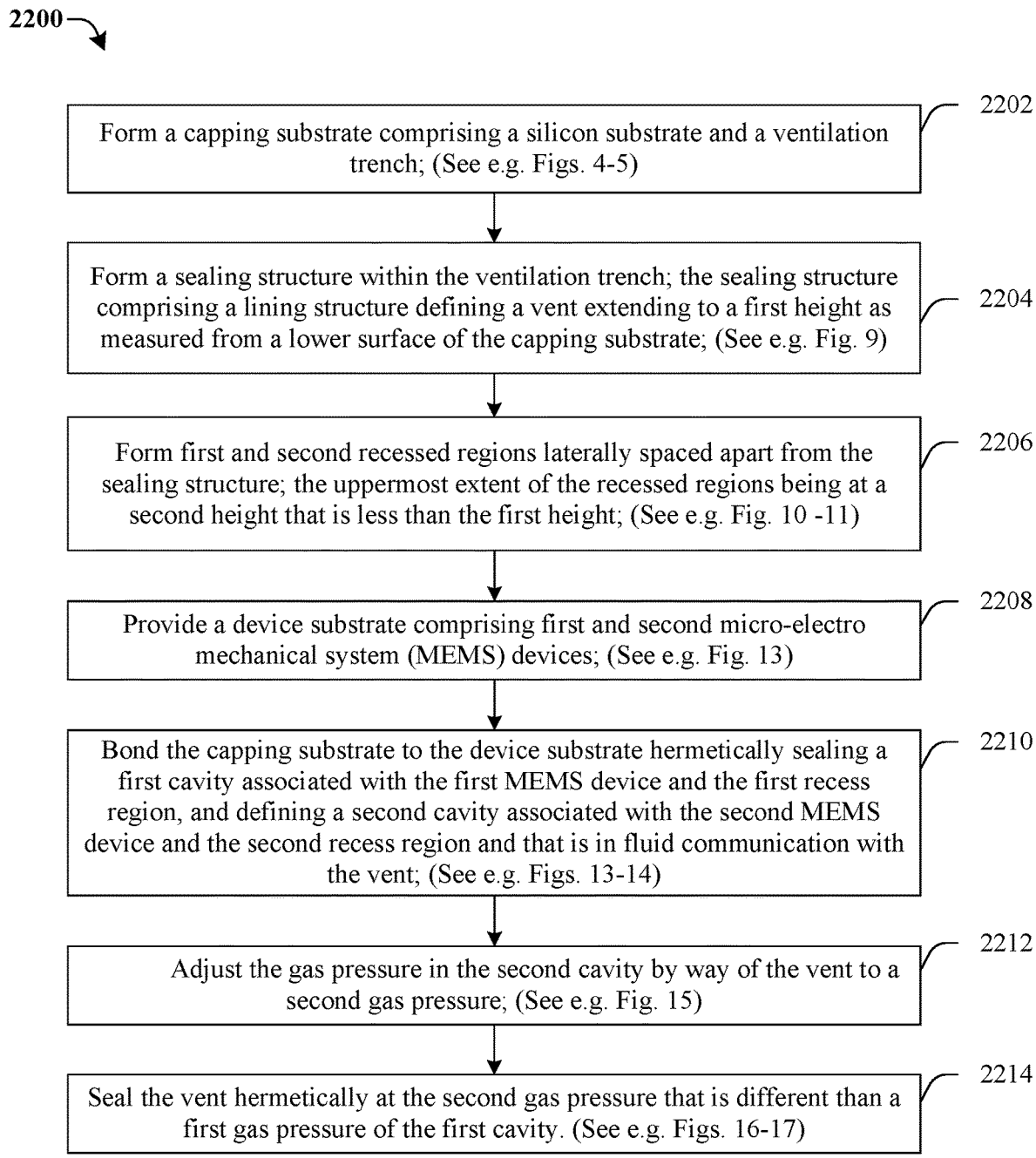
FIG. 22 illustrates a flowchart of some embodiments of the method of FIGS. 4-21.

With reference to FIG. 22, a flowchart 2200 of some embodiments of the method of FIGS. 4-21 is provided.

At 2202, a capping substrate is formed comprising a silicon substrate and a ventilation trench. FIGS. 4-5 illustrate cross-sectional views corresponding to some embodiments of act 2202.

At 2204, a sealing structure is formed within the ventilation trench. The sealing structure comprises a lining structure lining the walls of the ventilation trench. The lining structure is open at its inner surface defining a vent extending to a first height as measured from a lower surface of the capping substrate. FIGS. 9 and 19 illustrate cross-sectional views corresponding to some embodiments of act 2204.

At 2206, first and second recessed regions are formed and are laterally spaced apart from the sealing structure. The uppermost extent of the recessed regions extends to a second height that is less than the first height. FIGS. 10-11 and FIGS. 20-21 illustrate cross-sectional views corresponding to some embodiments of act 2206.

At 2208, a device substrate is provided comprising first and second micro-electro mechanical system (MEMS) devices. In some embodiments, the device substrate comprises a MEMS substrate 206 having a first MEMS device 104A and a second MEMS device 104B disposed in a horizontal plane. FIG. 13 illustrates a cross-sectional view corresponding to some embodiments of act 2208.

At 2210, the capping substrate is bonded to the device substrate hermetically sealing a first cavity associated with the first MEMS device and the first recess region, and defining a second cavity associated with the second MEMS device and the second recess region and that is in fluid communication with the vent. FIGS. 13-14 illustrate cross-sectional views corresponding to some embodiments of act 2210.

At 2212, the gas pressure in the second cavity is adjusted by way of the vent to a second gas pressure. In some embodiments, a first gas pressure of the second cavity is exchanged with the second gas pressure of the ambient environment, wherein the second gas pressure is different than the first gas pressure. FIG. 15 illustrates a cross-sectional view corresponding to some embodiments of act 2212.

At 2214, the vent is hermetically sealed at the second gas pressure that is different than a first gas pressure of the first cavity. In some embodiments, the sealing of the vent is accomplished by fabricating a cap over the vent at an upper surface of the capping substrate. FIGS. 16-17 illustrate cross-sectional views corresponding to some embodiments of act 2214.

While the flowchart 2200 of FIG. 22 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide for a method of forming a micro-electro mechanical system (MEMS) structure. The method comprises forming a ventilation trench and an isolation trench concurrently within a capping substrate. The isolation trench isolates a silicon region and has a height substantially equal to a height of the ventilation trench. The method further comprises forming a sealing structure within the ventilation trench and the isolation trench, the sealing structure filing the isolation trench and defining a vent within the ventilation trench. The method further comprises providing a device substrate comprising a first MEMS device and a second MEMS device and bonding the device substrate to the capping substrate at a first gas pressure and hermetically sealing a first cavity associated with the first MEMS device and a second cavity associated with the second MEMS device. The second cavity is in fluid communication with the vent. The method further comprises thinning the capping substrate to open the vent and adjusting a gas pressure of the second cavity to a second gas pressure different than the first gas pressure.

Further, other embodiments of the present application provide a method for manufacturing a MEMS package. The method comprises forming a capping substrate comprising a ventilation trench within the capping substrate. The method further comprises forming a lining structure including a dielectric layer on sidewalls of the ventilation trench and a polysilicon layer over the dielectric layer, the lining structure leaving an opening that defines a vent and forming a sealing structure within the ventilation trench. The method further comprises providing a device substrate comprising first MEMS device and second MEMS device and bonding the capping substrate to the device substrate hermetically sealing a first cavity at a first gas pressure associated with the first MEMS device and defining a second cavity associated with the second MEMS device. The second cavity is in fluid communication with the vent. The method further comprises adjusting a gas pressure in the second cavity through the vent and sealing the vent hermetically at a second gas pressure that is different than the first gas pressure of the first cavity.

Further yet, other embodiments of the present application provide a method for manufacturing MEMS package. The method comprises forming a capping substrate comprising a ventilation trench extending from a front side of the capping substrate to a position within the capping substrate and forming a sealing structure within the ventilation trench, the sealing structure defining a vent within the capping substrate. The sealing structure includes an overhang meeting at the front side of the capping substrate and sealing the ventilation trench from top. The method further comprises providing a device substrate comprising a first MEMS device and a second MEMS device. The method further comprises removing the overhang of the sealing structure and bonding the device substrate to the capping substrate hermetically sealing a first cavity associated with the first MEMS device and a second cavity associated with the second MEMS device, the second cavity being in fluid communication with the vent. The method further comprises adjusting a gas pressure of the second cavity to a second gas pressure and sealing the vent hermetically at the second gas pressure that is different than a first gas pressure of the first cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a micro-electro mechanical system (MEMS) structure, comprising:
   forming a ventilation trench and an isolation trench concurrently within a capping substrate, wherein the isolation trench surrounds a silicon region and has a height substantially equal to a height of the ventilation trench;
   forming a sealing structure within the ventilation trench and the isolation trench, the sealing structure filing the isolation trench and defining a vent within the ventilation trench;
   providing a device substrate comprising a first MEMS device and a second MEMS device;
   bonding the device substrate to the capping substrate at a first gas pressure and hermetically sealing a first cavity associated with the first MEMS device and a second cavity associated with the second MEMS device, wherein the second cavity is in fluid communication with the vent; and thinning the capping substrate to open the vent and adjusting a gas pressure of the second cavity to a second gas pressure different than the first gas pressure.

2. The method of claim 1, wherein the forming of the sealing structure comprises depositing a lining structure along a sidewall surface and a bottom surface of the ventilation trench.

3. The method of claim 1, further comprises performing a first dry etch to the sealing structure to etch a first recess region and a second recessed region corresponding to the first MEMS device and the second MEMS device.

4. The method of claim 3, wherein the first dry etch leaves a portion of the sealing structure directly overlying the silicon region as a bonding pad.

5. The method of claim 4, wherein the first recess region and the second recessed region have the same depth.

6. The method of claim 1, wherein the bonding of the capping substrate to the device substrate electrically couples the silicon region to the device substrate.

7. The method of claim 1, wherein forming the sealing structure comprises:
   forming an oxide layer on sidewall and bottom surfaces of the ventilation trench;
   forming a polysilicon layer on the oxide layer; and
   forming a metallic layer on the polysilicon layer.

8. The method of claim 4, further comprises performing a second dry etch to the capping substrate to further deepen the first recess region and the second recessed region corresponding to the first MEMS device and the second MEMS device.

9. A method of forming a micro-electro mechanical system (MEMS) structure, comprising:
   forming a capping substrate comprising a ventilation trench within the capping substrate;
   forming a lining structure including a first dielectric layer on sidewalls of the ventilation trench and a first polysilicon layer over the first dielectric layer, the lining structure leaving an opening that defines a vent;
   forming a sealing structure within the ventilation trench;
   providing a device substrate comprising first MEMS device and second MEMS device;
   bonding the capping substrate to the device substrate hermetically sealing a first cavity at a first gas pressure associated with the first MEMS device, and defining a second cavity associated with the second MEMS device, wherein the second cavity is in fluid communication with the vent; and
   adjusting a gas pressure in the second cavity through the vent and sealing the vent hermetically at a second gas pressure that is different than the first gas pressure of the first cavity.

10. The method of claim 9, wherein the bonding of the capping substrate to the device substrate is accomplished in a wafer to wafer bonding process.

11. The method of claim 10, wherein the adjusting of the gas pressure in the second cavity comprises:
   thinning the capping substrate from an upper surface to open the vent; and
   exchanging a gas pressure of the second cavity with the second gas pressure of an ambient environment.

12. The method of claim 9, wherein forming the lining structure further comprises:
   forming a metallic layer over the first polysilicon layer within the vent.

13. The method of claim 9, wherein the forming of the capping substrate further comprises:
forming a silicon pillar laterally spaced apart from the first MEMS device and the second MEMS device, comprising:
   forming an isolation trench within the capping substrate that surrounds a silicon region; and
   forming an insulating structure within the isolation trenches, the insulating structure comprising:
   a second dielectric layer selectively lining sidewalls of the isolation trenches but not lining a lower surface of the silicon pillar, and
   a second polysilicon layer disposed over the second dielectric layer and in direct contact with the lower surface of the silicon pillar.

14. The method of claim 13, wherein bonding of the capping substrate to the device substrate electrically couples the silicon pillar to the device substrate.

15. The method of claim 13, wherein the first dielectric layer and the second dielectric layer are formed simultaneously within the sealing structure and the insulating structure, and wherein the first polysilicon layer and the second polysilicon layer are formed simultaneously within the sealing structure and the insulating structure.

16. A method of forming a micro-electro mechanical system (MEMS) structure, comprising:
   forming a capping substrate comprising a ventilation trench extending from a front side of the capping substrate to a position within the capping substrate;
   forming a sealing structure within the ventilation trench, wherein the sealing structure is formed by forming a lining structure along a sidewall surface and a bottom surface of the ventilation trench defining a vent within the capping substrate;
   providing a device substrate comprising a first MEMS device and a second MEMS device;
   bonding the device substrate to the capping substrate hermetically sealing a first cavity associated with the first MEMS device and a second cavity associated with the second MEMS device, the second cavity being in fluid communication with the vent;
   adjusting a gas pressure of the second cavity to a second gas pressure; and
   sealing the vent hermetically at the second gas pressure that is different than a first gas pressure of the first cavity.

17. The method of claim 16, wherein the adjusting of the gas pressure in the second cavity comprises:
   thinning the capping substrate to open the vent, the second cavity is in fluid communication with an ambient environment through the vent; and
   adjusting an ambient environment to the second gas pressure different than the first gas pressure.

18. The method of claim 16, wherein the lining structure is formed conformally.

19. The method of claim 18, wherein forming the lining structure comprises:
   forming a dielectric layer on the sidewall and bottom surfaces of the ventilation trench;
   forming a polysilicon layer on the dielectric layer; and
   forming a metallic layer on the polysilicon layer.

20. The method of claim 16, a first recess as a part of the first cavity and a second recess as a part of the second cavity are formed when patterning the sealing structure, the first and second recesses being laterally spaced apart from the ventilation trench.

* * * * *